United States Patent
Chun et al.

(10) Patent No.: US 8,716,395 B2
(45) Date of Patent: May 6, 2014

(54) LIGHT-EMITTING-ELEMENT ENCAPSULATING COMPOSITION, LIGHT-EMITTING DIODE AND LIQUID-CRYSTAL DISPLAY DEVICE

(75) Inventors: Sang Ki Chun, Daejeon (KR); In Seok Hwang, Daejeon (KR); Dong-Wook Lee, Daejeon (KR); Ji Young Hwang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 86 days.

(21) Appl. No.: 13/386,001

(22) PCT Filed: Jul. 20, 2010

(86) PCT No.: PCT/KR2010/004742
§ 371 (c)(1),
(2), (4) Date: Mar. 20, 2012

(87) PCT Pub. No.: WO2011/010854
PCT Pub. Date: Jan. 27, 2011

(65) Prior Publication Data
US 2012/0168781 A1    Jul. 5, 2012

(30) Foreign Application Priority Data

Jul. 20, 2009 (KR) .................. 10-2009-0065757

(51) Int. Cl.
*C08L 83/04* (2006.01)
(52) U.S. Cl.
USPC ............ 524/588; 252/519.2; 252/519.4; 524/99; 524/104; 524/106; 524/167; 524/168; 524/174; 524/189; 524/190; 524/236; 524/251; 524/252; 524/356; 525/477
(58) Field of Classification Search
None
See application file for complete search history.

(56) References Cited

U.S. PATENT DOCUMENTS

| | | | |
|---|---|---|---|
| 2007/0141329 A1* | 6/2007 | Yang et al. | 428/343 |
| 2008/0311380 A1 | 12/2008 | Agrawal | |
| 2009/0012218 A1* | 1/2009 | Kuroda | 524/165 |
| 2011/0039991 A1* | 2/2011 | Iijima et al. | 524/99 |
| 2011/0076424 A1* | 3/2011 | Pellerite et al. | 428/1.31 |

FOREIGN PATENT DOCUMENTS

| | | |
|---|---|---|
| JP | 2007-012566 | 1/2007 |
| JP | 2007-305550 | 11/2007 |
| JP | 2007-324053 | 12/2007 |
| JP | 2008-084664 | 4/2008 |
| JP | 2009-221364 A * | 10/2009 |
| JP | 2009-224747 | 10/2009 |
| JP | 2010-271539 | 12/2010 |
| JP | 2011-023395 | 2/2011 |
| KR | 10-2005-0056140 A | 6/2005 |
| KR | 10-2007-0051704 A | 5/2007 |
| WO | WO 2007/108659 A1 * | 9/2007 |
| WO | WO 2009/084730 A1 * | 7/2009 |
| WO | WO 2010/084938 A1 | 7/2010 |
| WO | WO 2010/084939 A1 | 7/2010 |

OTHER PUBLICATIONS

Machine-gnerated translation of JP 2009-221364 into the English language.*

* cited by examiner

*Primary Examiner* — Marc Zimmer
(74) *Attorney, Agent, or Firm* — McKenna Long & Aldridge LLP

(57) ABSTRACT

An encapsulating composition for a light emitting element, a light emitting diode (LED) and a liquid crystal display device (LCD) are provided. A silicone-cured product included as a main ingredient and a conductivity-providing agent having excellent compatibility and capable of providing superior conductivity can be used to significantly reduce the surface resistivity of the silicone-cured product. Therefore, the encapsulating composition for a light emitting element, the LED and the LCD can be useful in solving the problems regarding attachment of a foreign substance such as dust due to static electricity, and degradation of transparency since the composition has low surface resistivity when used as a semiconductor encapsulation material for an LED, and also in providing a cured product having excellent properties such as light resistance, heat resistance, durability and optical transparency.

12 Claims, No Drawings

LIGHT-EMITTING-ELEMENT ENCAPSULATING COMPOSITION, LIGHT-EMITTING DIODE AND LIQUID-CRYSTAL DISPLAY DEVICE

This application is a National Stage Entry of International Application No. PCT/KR2010/004742, filed Jul. 20, 2010, and claims the benefit of Korean Application No. 10-2009-0065757, filed on Jul. 20, 2009, which is hereby incorporated by reference for all purposes as if fully set forth herein.

TECHNICAL FIELD

The present invention relates to an encapsulating composition for a light emitting element, a light emitting diode including a cured product of the composition, and a liquid crystal display device.

BACKGROUND

As light emitting diodes (LEDs), particularly blue or ultraviolet (UV) LEDs having an emission wavelength of approximately 250 nm to 550 nm, high-brightness products using a compound semiconductor made of a GaN-based material such as GaN, GaAlN, InGaN or InAlGaN have been developed. Therefore, it is possible to form a high-definition full-color image using a technique of combining the above-described blue LEDs with red and green LEDs. For example, a white LED can be produced by combination of the blue or UV LED with a fluorescent material. Such a white LED is expected to be used for backlights of a liquid crystal display device (LCD) or general lightings.

As described above, an epoxy resin including an acid anhydride-based curing agent and thus having a high adhesive property and excellent dynamic durability has been widely used in the art as an encapsulation material for a red, green, blue or UV LED. However, the epoxy resin-based encapsulation material has problems in that it has low transmittance with respect to light ranging from blue to UV wavelength ranges and also shows poor light resistance, such as discoloration caused by degradation due to light. Accordingly, a technique associated with the epoxy resin encapsulation material has been proposed to solve the above-mentioned problems (for example, Japanese Patent Laid-open Publication Nos. Hei 11-274571, 2001-196151 or 2002-226551).

However, the epoxy resin encapsulation materials as described in the above-mentioned patent documents have a problem in that they still show poor light resistance.

Meanwhile, attention has been drawn to a silicone resin as a material having excellent light resistance at a low wavelength range. However, the silicone resin has problems in that its heat resistance representative of a glass transition temperature may be degraded, its surface has a tack property, a foreign substance such as dust may be easily attached to a cured product due to static electricity since the cured product has very high resistivity, and properties such as transparency may be easily degraded.

SUMMARY

The present invention is directed to providing a composition for encapsulating a light emitting element, a light emitting diode (LED) and a liquid crystal display device (LCD), which is able to solve the problems regarding attachment of foreign substances due to static electricity, or degradation of transparency since the composition has low surface resistivity when used as a semiconductor encapsulation material for an LED, and also provide a cured product having excellent properties such as light resistance, heat resistance, durability and optical transparency.

One aspect of the present invention provides an encapsulating composition for a light emitting element including a curable silicone compound; and a conductivity-providing agent represented by the following Formula 1.

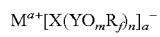

Formula 1

In Formula 1, $M^{a+}$ represents an inorganic or organic cation, X represents a nitrogen or carbon atom, Y represents a carbon or sulfur atom, $R_f$ represents a perfluoroalkyl group, a and m each independently represent an integer of 1 or 2, and n represents an integer of 2 or 3 (provided that m is the integer 1 when Y is a carbon atom, m is the integer 2 when Y is a sulfur atom, n is the integer 2 when X is a nitrogen atom, and n is the integer 3 when X is a carbon atom).

Another aspect of the present invention provides an LED including the light emitting element encapsulated by a cured product of the above-described composition for encapsulating a light emitting element according to the present invention.

Still another aspect of the present invention provides an LCD including the above-described LED according to the present invention.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

The present invention is directed to providing an encapsulating composition for a light emitting element, which includes a curable silicone compound; and a conductivity-providing agent represented by the following Formula 1.

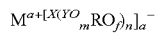

Formula 1

In Formula 1, $M^{a+}$ represents an inorganic or organic cation, X represents a nitrogen or carbon atom, Y represents a carbon or sulfur atom, $R_f$ represents a perfluoroalkyl group, a and m each independently represent an integer of 1 or 2, and n represents an integer of 2 or 3 (provided that m is the integer 1 when Y is a carbon atom, m is the integer 2 when Y is a sulfur atom, n is the integer 2 when X is a nitrogen atom, and n is the integer 3 when X is a carbon atom).

Hereinafter, the encapsulating composition for a light emitting element according to the present invention will be described in detail.

The kinds of curable silicone compounds which may be used in the present invention are not particularly limited. According to the present invention, as long as cured products of curable silicone compounds have excellent properties such as durability, formability, optical transparency and crack resistance when exposed to blue light or UV rays, the curable silicone compounds known in the art may be used without limitation. According to one exemplary embodiment of the present invention, the curable silicone compound may be a heat-curable silicone compound or a UV-curable silicone compound.

As such, examples of the heat-curable silicone compound may include, but are not limited to, a hydrosilylation-reactive, silanol condensation-reactive, alcohol-releasing, oxime-releasing or acetic acid-releasing silicone compound. Also, examples of the UV-curable silicone compound may include, but are not limited to, a (meth)acryl functional silicone (for example, a silicone compound disclosed in Japanese Patent Laid-open Publication No. Hei01-304108), a silicone containing a vinyl group and a mercapto group as functional groups (for example, a silicone compound disclosed in Japanese Patent Laid-open Publication No. Sho53-37376), an epoxy functional silicone (for example, a silicone compound disclosed in Japanese Patent Laid-open Publication No. Sho58-174418), a vinyl ether functional silicone (for example, a silicone compound disclosed in U.S. Pat. No. 4,617,238 issued by Crivello, J. V., Eckberg, R. P.), and a silanol functional silicone (for example, a cured product of a composition including poly(silsesquioxane) or poly(silsesquioxane) and tetraphenoxysilane (Japanese Patent Laid-open Publication No. Hei06-148887), a curable composition including a siloxane polymer and a base-generating material (Japanese Patent Laid-open Publication No. Hei06-273936) and a silicone compound disclosed in Japanese Patent Laid-open Publication No. Hei07-69610).

According to one exemplary embodiment of the present invention, the curable silicone compound may be an addition-curable silicone compound which may include (1) an organopolysiloxane containing two or more alkenyl groups in the molecule and (2) an organopolysiloxane containing two or more hydrogen atoms binding to silicone atoms in the molecule.

For example, such a silicone compound may form a cured product using an addition reaction in the presence of a catalyst as will be described later.

As such, the organopolysiloxane (1) is a major ingredient constituting a silicone-cured product, and contains at least two alkenyl groups in one molecule. In this case, specific examples of the alkenyl group include a vinyl group, an allyl group, a butenyl group, a pentenyl group, a hexenyl group or a heptenyl group, and a vinyl group may be chosen in some embodiments, but the present invention is not limited thereto. In the organopolysiloxane (1), a binding site of the above-described alkenyl group is not particularly limited. For example, the alkenyl group may be bound to the terminus and/or a side chain of a molecular chain. Also, the kind of substituents that may be included in addition to the above-described alkenyl group in the organopolysiloxane (1) may include an alkyl group such as a methyl group, an ethyl group, a propyl group, a butyl group, a pentyl group, a hexyl group or a heptyl group; an aryl group such as a phenyl group, a tolyl group, a xylyl group or a naphthyl group; an aralkyl group such as a benzyl group or a pentenyl group; or a halogen-substituted alkyl group such as a chloromethyl group, a 3-chloropropyl group or a 3,3,3-trifluoropropyl group, and a methyl group or a phenyl group may be chosen in some embodiments, but the present invention is not limited thereto.

The molecular structure of the above-described organopolysiloxane (1) is not particularly limited, and may have any shape such as, for example, a linear, branched, cyclic, or reticular shape, or a linear shape having some branched chains. According to the present invention, the organopolysiloxane (1) particularly has a linear molecular structure among the above-described molecular structures, but the present invention is not limited thereto. Meanwhile, according to the present invention, an organopolysiloxane containing an aromatic group such as an aryl group or an aralkyl group in the molecular structure can be used as the organopolysiloxane (1) in view of the hardness and refractive index of a cured product, but the present invention is not particularly limited thereto.

More specific examples of the organopolysiloxane (1) that may be used in the present invention may include a dimethylsiloxane-methylvinylsiloxane copolymer in which both termini of a molecular chain are blocked with trimethylsiloxane groups, a methylvinylpolysiloxane in which both termini of a molecular chain are blocked with trimethylsiloxane groups, a dimethylsiloxane-methylvinylsiloxane-methylphenylsiloxane copolymer in which both termini of a molecular chain are blocked with trimethylsiloxane groups, a dimethylpolysiloxane in which both termini of a molecular chain are blocked with dimethylvinylsiloxane groups, a methylvinylpolysiloxane in which both termini of a molecular chain are blocked with dimethylvinylsiloxane groups, a dimethylsiloxane-methylvinylsiloxane copolymer in which both termini of a molecular chain are blocked with dimethylvinylsiloxane groups, a dimethylsiloxane-methylvinylsiloxane-methylphenylsiloxane copolymer in which both termini of a molecular chain are blocked with dimethylvinylsiloxane groups, an organopolysiloxane copolymer including a siloxane unit represented by $R^1{}_2SiO_{1/2}$, a siloxane unit represented by $R^1{}_2R^2SiO_{1/2}$ and a siloxane unit represented by $SiO_{4/2}$, an organopolysiloxane copolymer including a siloxane unit represented by $R^1{}_2R^2SiO_{1/2}$ and a siloxane unit represented by $SiO_{4/2}$, an organopolysiloxane copolymer including a siloxane unit represented by $R^1R^2SiO_{2/2}$ and a siloxane unit represented by $R^1SiO_{3/2}$ or a siloxane unit represented by $R^2SiO_{3/2}$, and a mixture of at least two thereof, but the present invention is not limited thereto. As such, $R^1$ may be a hydrocarbon group rather than the alkenyl group, and more particularly an alkyl group such as a methyl group, an ethyl group, a propyl group, a butyl group, a pentyl group, a hexyl group or a heptyl group; an aryl group such as a phenyl group, a tolyl group, a xylyl group or a naphthyl group; an aralkyl group such as a benzyl group or a pentenyl group; or a halogen-substituted alkyl group such as a chloromethyl group, a 3-chloropropyl group or a 3,3,3-trifluoropropyl group. As such, $R^2$ may also be an alkenyl group, and more particularly a vinyl group, an allyl group, a butenyl group, a pentenyl group, a hexenyl group or a heptenyl group.

According to one exemplary embodiment of the present invention, the organopolysiloxane (1) may have a viscosity at 25° C. of 50 to 500,000 centipoises (CP), or 400 to 100,000 CP. When the viscosity of the organopolysiloxane (1) is less than 50 CP, a mechanical strength of a cured product of the silicone compound may be degraded. On the other hand, when the viscosity of the organopolysiloxane (1) exceeds 500,000 CP, handling or workability may be degraded.

In the addition-curable silicone compound, the organopolysiloxane (2) may serve to cross-link the organopolysiloxane (1). In the organopolysiloxane (2), a binding site of a hydrogen atom is not particularly limited, and may be, for example, bound to the terminus and/or a side chain of a molecular chain. Also in the organopolysiloxane (2), the kind of substituents that may be included in addition to the hydrogen atom binding to the silicone atom are not particularly limited, and may, for example, include an alkyl group, an aryl group, an aralkyl group or a halogen-substituted alkyl group, as described above in the organopolysiloxane (1), and a methyl group or a phenyl group may be chosen in some embodiments, but the present invention is not limited thereto.

Meanwhile, a molecular structure of the organopolysiloxane (2) is not particularly limited, and may have any shape such as, for example, a linear, branched, cyclic, or reticular shape, or a linear shape having some branched chains. According to the present invention, the organopolysiloxane (2) have a linear molecular structure among the above-described molecular structures can be chosen in some embodiments, but the present invention is not limited thereto.

More specific examples of the organopolysiloxane (2) that may be used in the present invention may include a methylhydrogenpolysiloxane in which both termini of a molecular chain are blocked with trimethylsiloxane groups, a dimethylsiloxane-methylhydrogen copolymer in which both termini of a molecular chain are blocked with trimethylsiloxane groups, a dimethylsiloxane-methylhydrogensiloxane-methylphenylsiloxane copolymer in which both termini of a molecular chain are blocked with trimethylsiloxane groups, a dimethylpolysiloxane in which both termini of a molecular chain are blocked with dimethylhydrogensiloxane groups, a dimethylsiloxane-methylphenylsiloxane copolymer in which both termini of a molecular chain are blocked with dimethylhydrogensiloxane groups, a methylphenylpolysiloxane in which both termini of a molecular chain are blocked with dimethylhydrogensiloxane groups, an organopolysiloxane copolymer including a siloxane unit represented by $R^1{}_3SiO_{1/2}$, a siloxane unit represented by $R^1{}_2HSiO_{1/2}$ and a siloxane unit represented by $SiO_{4/2}$, an organopolysiloxane copolymer including a siloxane unit represented by $R^1{}_2HSiO_{1/2}$ and a siloxane unit represented by $SiO_{4/2}$, an organopolysiloxane copolymer including a siloxane unit represented by $R^1HSiO_{2/2}$ and a siloxane unit represented by $R^1SiO_{3/2}$ or a siloxane unit represented by $HSiO_{3/2}$, and a mixture of at least two thereof, but the present invention is not limited thereto. As such, $R^1$ may be a hydrocarbon group rather than the alkenyl group, and more particularly an alkyl group such as a methyl group, an ethyl group, a propyl group, a butyl group, a pentyl group, a hexyl group or a heptyl group; an aryl group such as a phenyl group, a tolyl group, a xylyl group or a naphthyl group; an aralkyl group such as a benzyl group or a pentenyl group; or a halogen-substituted alkyl group such as a chloromethyl group, a 3-chloropropyl group or a 3,3,3-trifluoropropyl group.

According to one exemplary embodiment of the present invention, the organopolysiloxane (2) may have a viscosity at 25° C. of 1 to 500,000 CP, or 5 to 100,000 CP. When the viscosity of the organopolysiloxane (2) is less than 1 CP, a mechanical strength of a cured product of the silicone compound may be degraded. On the other hand, when the viscosity of the organopolysiloxane (2) exceeds 500,000 CP, handling or workability may be degraded.

According to one exemplary embodiment of the present invention, as long as the organopolysiloxane (2) is included at such a content that a composition can be properly cured, the content of the organopolysiloxane (2) may be used without particular limitation. For example, the organopolysiloxane (2) may contain 0.5 to 10 hydrogen atoms binding to silicone atoms, based on one alkenyl group included in the above-described organopolysiloxane (1). When the number of the hydrogen atoms binding to the silicone atoms is less than 0.5, a curable silicone compound may be insufficiently cured, whereas, when the number of the hydrogen atoms binding to the silicone atoms exceeds 10, heat resistance of a cured product may be degraded. Meanwhile, according the present invention, an organopolysiloxane containing an aromatic group such as an aryl group or an aralkyl group in the molecular structure can be used as the organopolysiloxane (2) in view of the hardness and refractive index of a cured product, but the present invention is not particularly limited thereto.

According to one exemplary embodiment of the present invention, the addition-curable silicone compound may further include platinum or a platinum compound as a catalyst for curing. As such, specific examples of the platinum or platinum compound may include a platinum fine powder, platinum black, a platinum-supported silica fine powder, platinum-supported activated charcoal, chloroplatinic acid, platinum tetrachloride, an alcohol solution of chloroplatinic acid, a complex of platinum and olefin, a complex of platinum and alkenylsiloxane such as 1,1,3,3-tetramethyl-1,3-divinyl-disiloxane, and a thermoplastic resin fine powder (i.e., a polystyrene resin, a nylon resin, a polycarbonate resin or a silicone resin) including platinum or a platinum compound and having a particle diameter of less than 10 μm, but the present invention is not limited thereto.

A content of the above-described catalyst in the addition-curable silicone compound according to the present invention is not particularly limited, and may be, for example, included at a content of 0.1 to 500 ppm, or 1 to 50 ppm, based on the total weight of the addition-curable silicone compound. When the content of the catalyst is less than 0.1 ppm, a curing property of the composition may be degraded, whereas, when the content of the catalyst exceeds 500 ppm, economical efficiency may be poor.

According to one exemplary embodiment of the present invention, the addition-curable silicone compound may further include an alkyne alcohol such as 3-methyl-1-butyn-3-ol, 3,5-dimethyl-1-hexin-3-ol or phenylbutynol; an enyne compound such as 3-methyl-3-penten-1-yne or 3,5-dimethyl-3-hexen-1-yne; or a curing inhibitor such as 1,2,5,7-tetramethyl-1,3,5,7-tetravinylcyclotetrasiloxane, 1,3,5,7-tetramethyl-1,3,5,7-tetrahexenylcyclotetrasiloxane or benzotriazole so as to improve storage stability, handling and workability of the silicone compound. A content of the curing inhibitor may be properly selected without causing damage to the objects of the present invention. For example, the curing inhibitor may be included at a content of 10 ppm to 50,000 ppm, based on the total weight of the addition-curable silicone compound.

According to another exemplary embodiment of the present invention, the silicone compound may, for example, include (a) an alkoxy group-containing siloxane polymer; and (b) a hydroxyl group-containing siloxane polymer as the condensation-curable silicone compounds.

For example, the siloxane polymer (a) that may be used in the present invention may be a compound represented by the following Formula 2.

$$R^7_a R^8_b SiO_c(OR^9)_d \quad \text{Formula 2}$$

In Formula 2, $R^7$ and $R^8$ each independently represent a hydrogen atom or a substituted or unsubstituted monovalent hydrocarbon group, $R^9$ represents an alkyl group, provided that $R^7$, $R^8$ and $R^9$ may be the same as or different from each other when each of $R^7$, $R^8$ and $R^9$ is present in a plural form, a and b each independently represent a number of at least 0 and less than 1, provided that the sum of a and b represents integer number greater than 0 and less than 2, c represents a number greater than 0 and less than 2, and d represents a number greater than 0 and less than 4, provided that the sum of $a+b+c\times 2+d$ represents the integer 4.

According to the present invention, the siloxane polymer represented by Formula 2 may also have a weight average molecular weight of 1,000 to 100,000, 1,000 to 80,000, or 1,500 to 70,000, which is converted from that of a polystyrene standard as measured using gel permeation chromatography. When the weight average molecular weight of the siloxane polymer (a) is within this range, a high-quality cured product may be obtained without causing inferiority such as cracks upon formation of a silicone-cured product.

In the definition of Formula 2, a monovalent hydrocarbon group may be, for example, an alkyl group having 1 to 8 carbon atoms, a phenyl group, a benzyl group or a tolyl group. In this case, the alkyl group having 1 to 8 carbon atoms may be a methyl group, an ethyl group, a propyl group, an isopropyl group, a butyl group, a pentyl group, a hexyl group, a heptyl group or an octyl group. In the definition of Formula 2, the monovalent hydrocarbon group may be also substituted with one known substituent such as a halogen, an amino group, a mercapto group, an isocyanate group, a glycidyl group, a glycidoxy group or a ureido group.

Also in the definition of Formula 2, examples of the alkyl group of $R^9$ may include a methyl group, an ethyl group, a propyl group, an isopropyl group or a butyl group. Among such alkyl groups, a methyl group or an ethyl group may be chosen in some embodiments, but the present invention is not limited thereto.

According to the present invention, a branched or tertiary cross-linked siloxane polymer out of the polymers of Formula 2 may be used. Also, a hydroxyl group may be present in the siloxane polymer (a) without causing damage to the objects of the present invention, and more particularly, without negatively affecting a dealcoholization reaction.

Such a siloxane polymer (a) may be prepared, for example, by hydrolyzing and condensing a multifunctional alkoxysilane or a multifunctional chloro silane. A person having ordinary skill in the art can easily select a suitable multifunctional alkoxysilane or chloro silane according to the desired siloxane polymer (a), and also control the conditions of the hydrolysis and condensation reaction of the multifunctional alkoxysilane or chloro silane. Meanwhile, a suitable monofunctional alkoxy silane may be used together upon production of the siloxane polymer (a), when necessary.

For example, a commercially available organosiloxane polymer, such as X40-9220 or X40-9225 commercially available from Shin-Etsu Silicone, or XR31-B1410, XR31-B0270 or XR31-B2733 commercially available from GE Toray Silicone, may be used as such a siloxane polymer (a). Meanwhile, according to the present invention, an organosiloxane polymer including an aromatic group such as an aryl group or an aralkyl group in the molecular structure can be used as the siloxane polymer (a) in view of the hardness and refractive index of a cured product, but the present invention is not particularly limited thereto.

Meanwhile, a compound represented by the following Formula 3 may be, for example, used as the hydroxyl group-containing siloxane polymer (b) included in the condensation-curable silicone compound.

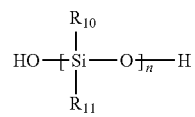

Formula 3

In Formula 3, $R_{10}$ and $R_{11}$ each independently represent a hydrogen atom or a substituted or unsubstituted monovalent hydrocarbon group, provided that $R_{10}$ and $R_{11}$ may be the same as or different from each other when each of $R_{10}$ and $R_{11}$ is present in a plural form, and n represents an integer ranging from 5 to 2,000.

In the definition of Formula 3, the specific kind of the monovalent hydrocarbon group may include the same hydrocarbon group as in Formula 2 as described above.

According to the present invention, the siloxane polymer of Formula 3 may have a weight average molecular weight of 500 to 100,000, 1,000 to 80,000, or 1,500 to 70,000, which is converted from that of a polystyrene standard as measured using gel permeation chromatography. When the weight average molecular weight of the siloxane polymer (b) is within this range, a high-quality cured product may be obtained without causing inferiority such as cracks upon formation of a silicone-cured product.

Such a siloxane polymer (b) may be prepared, for example, by hydrolyzing and condensing a dialkoxy silane and/or a dichloro silane. A person having ordinary skill in the art can easily select a suitable dialkoxy silane or dichloro silane according to the desired siloxane polymer (b), and also control the conditions of the hydrolysis and condensation reaction of the dialkoxy silane or dichloro silane. For example, a commercially available difunctional organosiloxane polymer, such as XC96-723, YF-3800 or YF-3804 commercially available from GE Toray Silicone, may be used as such a siloxane polymer (b). Meanwhile, according to the present invention, an organosiloxane polymer including an aromatic group such as an aryl group or an aralkyl group in the molecular structure can be used as the siloxane polymer (b) in view of the hardness and refractive index of a cured product, but the present invention is not particularly limited thereto.

According to the present invention, the conductivity-providing agent included together with the above-described silicone compound serves to prevent damage of transparency caused by high resistivity of a cured product of a composition, and attachment of a foreign substance such as dust since it endows the composition with proper conductivity without causing damage to properties such as durability, formability, optical transparency and crack resistance when the cured product of the composition is exposed to blue light or UV rays.

According to one exemplary embodiment of the present invention, the conductivity-providing agent may be represented by one of the certain Formulas as described above, and may include an inorganic or organic cation; and an anion containing a perfluoroalkyl group as a conjugate base of super acid. Such a conductivity-providing agent has a low coordinate bonding property and high hydrophobicity with respect to the cation because of a resonance structure of the anion and high electronegativity of a fluorine atom. Therefore, the conductivity-providing agent may show excellent compatibility to a silicone-cured product, and endow the cured product with excellent antistaticity without causing damage to its inherent merits.

$$M^{a+}[X(YO_mR_f)_n]_a^-$$  Formula 1

In Formula 1, $M^{a+}$ represents an inorganic or organic cation, X represents a nitrogen or carbon atom, Y represents a carbon or sulfur atom, $R_f$ represents a perfluoroalkyl group, a and m each independently represent an integer of 1 or 2, and n represents an integer of 2 or 3 (provided that m is the integer 1 when Y is a carbon atom, m is the integer 2 when Y is a sulfur atom, n is the integer 2 when X is a nitrogen atom, and n is the integer 3 when X is a carbon atom).

In the definition of Formula 1, the perfluoroalkyl group may be, for example, a perfluoroalkyl group having 1 to 12 carbon atoms, 1 to 8 carbon atoms, or 1 to 4 carbon atoms. More particularly, the perfluoroalkyl group may be a trifluoromethyl, pentafluoroethyl or perfluorobutyl group.

According to the present invention, the cation included in the conductivity-providing agent may be an inorganic or organic cation that can show desired effects without causing damage to its physical properties because of its excellent compatibility with the silicone-cured product.

Examples of the inorganic cation that may be used in the present invention may include an alkaline metal cation such as a lithium cation, a sodium cation, a potassium cation, a rubidium cation or a cesium cation; or an alkaline earth metal cation such as a calcium cation, a strontium cation, a barium cation or a radium cation. Among these inorganic cations, the alkaline metal cation may be used in the present invention, the lithium cation being chosen in some embodiments among these alkaline metal cations, but the present invention is not limited thereto.

According to one exemplary embodiment of the present invention, the cation included in the conductivity-providing agent may be an organic cation, for example, a nitrogen-based cation. As such, the nitrogen-based cation may show excellent compatibility with the silicone-cured product. Examples of such a nitrogen-based cation include an ammonium cation (for example, a primary, secondary, ternary or quaternary ammonium cation), a pyrazolium cation, an imidazolium cation, a triazolium cation, a pyridinium cation, a pyridazinium cation, a pyrimidinium cation, a pyrazinium cation, a pyrrolidinium cation or a triazinium cation, but the present invention is not limited thereto. According to another exemplary embodiment of the present invention, the organic cation may also be a phosphorus-based cation such as a phosphonium cation.

According to one exemplary embodiment of the present invention, the organic cation may contain a carbon, nitrogen or phosphorus atom substituted with at least one substituent. In this case, specific examples of the substituent of the organic cation may include a (cyclo)alkyl, (cyclo)alkenyl, (cyclo)alkynyl, alkoxy, alkendioxy, aryl, arylalkyl, aryloxy, amono, amonoalkyl, thio, thioalkyl, hydroxy, hydroxyalkyl, oxoalkyl, carboxyl, carboxyalkyl, haloalkyl or halogen atom.

In the definition of the substituent of the organic cation, an alkyl group may be an alkyl group having 1 to 12 carbon atoms, 1 to 8 carbon atoms, or 1 to 4 carbon atoms including a methyl, ethyl, propyl, butyl, cyclopropyl or cyclobutyl group, and an alkenyl or alkynyl group may be an alkenyl or alkynyl group having 2 to 12 carbon atoms, 2 to 8 carbon atoms, or 2 to 4 carbon atoms including an ethenyl, ethynyl, propenyl, propynyl, butenyl or butynyl group.

Also, in the definition of the substituent of the organic cation, an alkoxy group may be an alkoxy group having 1 to 12 carbon atoms, 1 to 8 carbon atoms, or 1 to 4 carbon atoms including a methoxy, ethoxy, propoxy or butoxy group, an aryl group may be an aryl group having 6 to 24 carbon atoms, or 6 to 12 carbon atoms, including a phenyl or naphthyl group, and a halogen may be chlorine or fluorine.

According to one exemplary embodiment of the present invention, the organic cation may be an ammonium cation, an imidazolium cation, a pyridinium cation or a pyrrolidinium cation, and an ammonium cation or an imidazolium cation can be chosen in some embodiments. Such an organic cation has advantages in that it may show excellent compatibility with a silicone-cured product as a hydrophobic additive, and also endow a silicone-cured product with stable and excellent conductivity due to low reactivity with moisture. In particular, the organic cation may show stable conductivity without degrading the conductivity with time.

According to one exemplary embodiment of the present invention, the ammonium cation may be, for example, a cation represented by the following Formula 4.

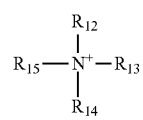

Formula 4

In Formula 4, $R_{12}$ to $R_{15}$ each independently represent hydrogen, a substituted or unsubstituted alkyl group, a substituted or unsubstituted alkoxy group, a substituted or unsubstituted alkenyl group or a substituted or unsubstituted alkynyl group.

In the definition of Formula 4, the alkyl or alkoxy group may represent an alkyl or alkoxy group having 1 to 12 carbon atoms, or 1 to 8 carbon atoms, and the alkenyl or alkynyl group may represent an alkenyl or alkynyl group having 2 to 12 carbon atoms, or 2 to 8 carbon atoms.

In the definition of Formula 4, the alkyl, alkoxy, alkenyl or alkynyl group may also be substituted with at least one substituent. In this case, examples of the substituent may include a hydroxyl group or an alkyl or alkoxy group having 1 to 12 carbon atoms, 1 to 8 carbon atoms, or 1 to 4 carbon atoms.

According to the present invention, a quaternary ammonium cation can be used among the examples of the cation of Formula 4, and a cation in which $R_{12}$ to $R_{15}$ are each independently a substituted or unsubstituted alkyl group having 1 to 12 carbon atoms can be chosen in particular embodiments.

An ammonium-based salt that may be used in the present invention may be at least one cation selected from the group consisting of N-ethyl-N,N-dimethyl-N-(2-methoxyethyl)ammonium, N,N-diethyl-N-methyl-N-(2-methoxyethyl)ammonium, N-ethyl-N,N-dimethyl-N-propylammonium, N-methyl-N,N,N-trioctylammonium, N,N,N-trimethyl-N-propylammonium, tetrabutylammonium, tetramethylammonium, tetrahexylarrunonium and N-methyl-N,N,N-tributylammonium.

Meanwhile, according to one exemplary embodiment of the present invention, the imidazolium cation may include imidazolium, 1-allyl-3-alkyl imidazolium, 1-alkyl-3-allyl imidazolium, 1,3-bisallyl imidazolium, 1,3-dialkyl imidazolium, 1-arylalkyl-3-alkyl imidazolium, 1,3-bis(arylalkyl)imidazolium, 1-aryl-3-alkyl imidazolium, 1,3-bisaryl imidazolium, 1,3-bis(cyanoalkyl)imidazolium or 1-alkyl-2,3-bisalkyl imidazolium. Among these, imidazolium, 1-allyl-3- alkyl imidazolium, 1-alkyl-3-allyl imidazolium, 1,3-bisallyl imidazolium or 1,3-dialkyl imidazolium can be used, and 1,3-dialkyl imidazolium can be chosen in one embodiment, but the present invention is not limited thereto.

In the kind of the imidazolium, a specific group such as an alkyl, aryl or arylalkyl group is as described above.

According to one exemplary embodiment of the present invention, the anion included in the conductivity-providing agent of Formula 1 may be a sulfonyl methide-based anion, a sulfonimide-based anion, a carbonyl methide-based anion or a carbonylimide-based anion. As such, examples of the sulfonyl methide-based anion may include tristrifluoromethanesulfonyl methide, examples of the sulfonimide-based anion may include bistrifluoromethanesulfonimide, bisperfluorobutanesulfonimide or bispentafluoroethanesulfonimide, examples of the carbonyl methide-based anion may include tristrifluoromethanecarbonyl methide, and examples of the carbonylimide-based anion may include bisperfluorobutanecarbonylimide or bispentafluoroethanecarbonylimide.

According to one exemplary embodiment of the present invention, the conductivity-providing agent may, for example, include N-ethyl-N,N-dimethyl-N-(2-methoxyethyl)ammonium bistrifluoromethanesulfonimide, N,N-diethyl-N-methyl-N-(2-methoxyethyl)ammonium bistrifluoromethanesulfonimide, N-ethyl-N,N-dimethyl-N-propylammonium bistrifluoromethanesulfonimide, N-methyl-N,N,N-trioctylammonium bistrifluoromethanesulfonimide, N-methyl-N,N,N-trioctylammonium bispentafluoroethanesulfonimide, N-methyl-N,N,N-trioctylammonium tristrifluoromethanecarbonyl methide, N,N,N-trimethyl-N-propylammonium bistrifluoromethanesulfonimide, tetrabutylammonium bistrifluoromethanesulfonimide, tetramethylammonium bistrifluoromethanesulfonimide, tetrahexylammonium bistrifluoromethanesulfonimide, N-methyl-N,N,N-tributylammonium bistrifluoromethanesulfonimide, 1,3-dialkyl imidazolium bistrifluoromethanesulfonimide, 1,3-dialkyl imidazolium bisperfluorobutanesulfonimide, 1,3-dialkyl imidazolium bispentafluoroethanesulfonimide, 1,3-dialkyl imidazolium tristrifluoromethanecarbonyl methide, 1,3-dialkyl imidazolium bisperfluorobutanecarbonylimide or 1,3-dialkyl imidazolium bispentafluoroethanecarbonylimide, but the present invention is not limited thereto.

According to the present invention, Such a conductivity-providing agent may be included at a content of 0.01 parts by weight to 20 parts by weight, 0.1 parts by weight to 15 parts by weight, or 0.5 parts by weight to 10 parts by weight, based on 100 parts by weight of the above-described curable silicone compound. When the content of the conductivity-providing agent is less than 0.01 parts by weight, endowment of a silicone-cured product with conductivity and reduction in surface resistivity may be degraded. On the other hand, when the content of the conductivity-providing agent exceeds 20 parts by weight, physical properties of the silicone-cured product, such as transparency or durability, may be degraded.

According to one exemplary embodiment of the present invention, the composition for encapsulating a light emitting element may further include an epoxy resin as an optional ingredient so as to improve an adhesion property to the light emitting element. Examples of the epoxy resin that may be used in the present invention may include an aromatic glycidyl ether, a glycidyl ether obtained by hydrogenating an aromatic ring of the aromatic glycidyl ether, and an alicyclic epoxy resin (for example, 3,4-epoxycyclohexylmethyl-3',4'-epoxy cyclohexane carboxylate, a 1,2-epoxy-4-(2-oxiranyl) cyclohexane addition product of 2,2-bis(hydroxymethyl)-1-butanol, or bis(3,4-epoxycyclohexylmethyl)adipate), but the present invention is not limited thereto. According to the present invention, in addition to the above-described components, a glycidyl ester such as a dimer acid glycidyl ester or a hexahydrophthalic acid glycidyl ester; a glycidyl amine such as triglycidyl isocyanurate; or a linear aliphatic epoxide such as an epoxidated soybean oil or epoxidated polybutadiene may also be used as the epoxy resin. According to the present invention, the above-described epoxy resin may be used alone or in combination. As such, examples of the aromatic glycidyl ether may include a bisphenol-type epoxy resin obtained by glycidylating a bisphenol such as bisphenol A, bisphenol F, bisphenol AD, bisphenol S, tetramethyl bisphenol A, tetramethyl bisphenol F, tetramethyl bisphenol AD, tetramethyl bisphenol S, tetrabromo bisphenol A, tetrachloro bisphenol A or tetrafluoro bisphenol A; an epoxy resin obtained by glycidylating a divalent phenol including biphenol, dihydroxy naphthalene or 9,9-bis(4-hydroxyphenyl)fluorene; an epoxy resin obtained by glycidylating a trisphenol such as 1,1,1-tris (4-hydroxyphenyl)methane or 4,4-(1-(4-(1-(4-hydroxyphenyl)-1-methylethyl)phenyl)ethylidene bisphenol; an epoxy resin obtained by glycidylating a tetrakis phenol such as 1,1,2,2-tetrakis(4-hydroxyphenyl)ethane; or a novolac-type epoxy resin obtained by glycidylating a novolac such as phenol novolac, cresol novolac, bisphenol A novolac, brominated phenol novolac or brominated bisphenol A novolac, but the present invention is not limited thereto.

As such, the glycidyl ether obtained by hydrogenating the aromatic ring of the aromatic glycidyl ether may be obtained, for example, by hydrogenating an aromatic ring of the above-described aromatic glycidyl ether in the presence of a catalyst such as a ruthenium catalyst or a rhodium catalyst.

According to the present invention, a content of the above-described epoxy resin may be properly selected in consideration of improvement of desired adhesive strength, without negatively affecting the effects of the present invention. According to the present invention, the epoxy resin may be, for example, included at a content of 100 parts by weight or less, 1 part by weight to 100 parts by weight, 1 part by weight to 80 parts by weight, or 1 part by weight to 60 parts by weight, based on 100 parts by weight of the above-described silicone compound, but the present invention is not limited thereto.

In addition to the above-described ingredients, the composition to encapsulate a light emitting element according to the present invention may include a proper amount of a known additive such as a curing accelerator, an antifoaming agent, a coloring agent, a fluorescent material, a phosphorescent material, a denaturing agent, a discoloration preventing agent, an inorganic filler, a silane coupling agent, a light diffusing agent or a thermally conductive filler, without negatively affecting the effects of the present invention.

Also, the present invention is directed to providing a light-emitting diode (LED) including a light-emitting-element encapsulated by a cured product of the above-described composition according to the present invention to encapsulate a light emitting element.

The kind of the light emitting element that may be used in the present invention is not particularly limited. For example, a light emitting element prepared by stacking a semiconductor material on a substrate may be used in the present invention. In this case, examples of the semiconductor material may include GaAs, GaP, GaAlAs, GaAsP, AlGaInP, GaN, InN, AlN, InGaAlN or SiC, but the present invention is not limited thereto. Also, examples of the substrate that may be used herein may include sapphire, spinel, SiC, Si, ZnO or GaN single crystal, but the present invention is not limited thereto.

According to the present invention, a buffer layer may also be formed between the substrate and the semiconductor material, when necessary. In this case, GaN or AlN may be used for the buffer layer. A method of stacking a semiconductor material on a substrate is not particularly limited, and may include a method such as MOCVD, HDVPE or liquid-phase growth. According to the present invention, the light emitting element may also have a structure such as a monojunction, a heterojunction or a double heterojunction, which includes an MIS junction, a PN junction or a PIN junction. Also, the light emitting element may be formed in a single or multiple quantum well structure.

According to one exemplary embodiment of the present invention, an emission wavelength of the light emitting element may be, for example, in a range of 250 nm to 550 nm, 300 nm to 500 nm, or 330 nm to 470 nm. As such, the emission wavelength refers to a main emission peak wavelength. When the emission wavelength of the light emitting element is set to this wavelength range, it is possible to obtain a white LED having high energy efficiency and color reproduction property as well as a longer lifespan.

The LED according to the present invention may be prepared by encapsulating a light emitting element, particularly a light emitting element having an emission wavelength of 250 nm to 550 nm, in a composition for encapsulating a light emitting element according to the present invention. In this case, the encapsulation of the light emitting element may be carried out using only the composition for encapsulating a light emitting element according to the present invention, and may optionally be carried out using the composition together with other encapsulation materials. When the composition is used together with the other encapsulation materials, the encapsulation may be carried out by encapsulating a light emitting element in the composition for encapsulating a light emitting element according to the present invention and encapsulating the composition in another encapsulation material, or by encapsulating a light emitting element in another encapsulation material and encapsulating the encapsulation material in the composition for encapsulating a light emitting element according to the present invention. In this case, the other encapsulation materials that may be used herein may include an epoxy resin, a silicone resin, an acryl resin, a urea resin, an imide resin or a glass.

For example, a method of encapsulating a light emitting element using the composition for encapsulating a light emitting element according to the present invention may include a method of pouring a composition for encapsulating a light emitting element into a mold-type cast in advance, immersing a lead frame having a light emitting element fixed therein in the composition and curing the composition, a method of pouring a composition for encapsulating a light emitting element in a cast containing a light emitting element and curing the composition, etc. In this case, examples of the method of pouring a composition for encapsulating a light emitting element may include methods such as injection using a dispenser, transfer molding, injection molding, etc. In addition, the encapsulation method that may be used herein may also include a method of dropping a composition for encapsulating a light emitting element onto a light emitting element, coating the composition using a stencil printing, screen printing or mask process and curing the composition, a method of pouring a composition for encapsulating a light emitting element into a cup having a light emitting element disposed at a bottom portion thereof using a dispenser and curing the composition, etc. Also, the composition for encapsulating a light emitting element according to the present invention may be used as a die bond material for fixing a light emitting element in a lead terminal or package, or used for a passivation film on a light emitting element, or a package substrate.

The shape of an encapsulated portion is not particularly limited, and may be, for example, made in the form of a shell-shaped lens, plate or thin film.

Meanwhile, the cured product of the composition for encapsulating a light emitting element, which may be used as the encapsulation material in the present invention, may have a surface resistivity of $5\times10^{14}$ Ω/square (□) or less, $5\times10^{12}$Ω/□ or less, or $5\times10^{11}$Ω/□ or less. When the surface resistivity of the cured product exceeds $5\times10^{14}$Ω/□, the conductivity of the cured product may be degraded, attachment of foreign substances to a surface of the cured product may be reduced, or the physical properties such as transparency may be degraded.

According to the present invention, it is also possible to facilitate further improvement of performance of the LED using a conventional known method. For example, a method of improving the performance may include a method of installing a light reflecting layer or a light collecting layer at rear surface of a light emitting element, a method of forming a complementary coloring portion on a bottom portion of a light emitting element, a method of installing a layer for absorbing light having a shorter wavelength than a main emission peak on a light emitting element, a method of encapsulating a light emitting element and further molding the light emitting element with a hard material, a method of inserting and fixing an LED in a through hole, and a method of emitting light toward a substrate by contacting a light emitting element with a lead member through a flip chip contacting process.

The LED according to the present invention may be, for example, effectively applied to backlights of a liquid crystal display device (LCD), lightings, various light sources of a sensor, a printer or a photocopier, dashboard light sources for a vehicle, traffic lights, pilot lamps, display devices, light sources of a surface light emitting device, displays, ornaments or various lights.

Hereinafter, the optical element will be described in detail with reference to Examples and Comparative Examples. However, the scope of the present invention is not limited by description of the following Examples.

Example 1

10 Parts by weight of a curing agent (Sylgard 184B commercially available from Dow Corning), 0.11 parts by weight of a conductivity-providing agent, lithium bis(trifluoromethanesulfonyl)imide, and 0.005 parts by weight of a platinum-based catalyst were mixed, based on 100 parts by weight of a liquid addition-curable silicone compound (Sylgard 184A commercially available from Dow Corning), to prepare a composition for encapsulating a light emitting element. Thereafter, the composition was poured into a disc-shaped mold having a diameter of 50 mm and a thickness of 10 mm, and cured at a temperature of 90° C. for 1 hour to prepare a silicone-cured product.

Example 2

A composition for encapsulating a light emitting element was prepared in the same manner as in Example 1, except that 1.1 parts by weight of lithium bis(trifluoromethanesulfonyl) imide was used as the conductivity-providing agent.

Example 3

A composition for encapsulating a light emitting element was prepared in the same manner as in Example 1, except that 11 parts by weight of lithium bis(trifluoromethanesulfonyl) imide was used as the conductivity-providing agent.

Comparative Example 1

A composition for encapsulating a light emitting element was prepared in the same manner as in Example 1, except that the conductivity-providing agent was not used.

Experimental Example 1

Measurement of Surface Resistivity

A voltage of 500 V was applied for 1 minute to each of the compositions for encapsulating a light emitting element as prepared in Examples and Comparative Example, and then measured for surface resistivity using a surface resistivity meter (MCP-HT260, Hinesta IP). The measurement results are listed in the following Table 1.

Experimental Example 2

Evaluation of Antistatic Characteristic (Vibration Damping Characteristic)

The vibration damping characteristics of the silicone-cured products prepared in Examples and Comparative Example were measured using the following method. First, one sheet of A4 paper was cut into pieces with a predetermined size, put into a petri-dish, and shaken to endow the paper with antistaticity. Then, the A4 paper pieces were scattered on each of the silicone resins prepared in Examples and Comparative Example, and the A4 paper pieces remaining in the silicone resin when the silicone resin was allowed to stand at a perfect right angle was then counted. The adhesion was evaluated according to the following criteria.
  ○: There are no paper pieces attached to the silicone resin.
  x: A large amount of paper pieces are attached to the silicone resin.

Experimental Example 3

Heat/Moisture Resistance Test

The silicone-cured products prepared in Examples and Comparative Example were kept at a temperature of 60° C. and a relative humidity of 90% for 500 hours, and the presence of bubbles and cracks was observed. Then, the durability was evaluated according to the following criteria.
  ○: There are no generated bubbles and cracks.
  Δ: Bubbles and cracks are slightly generated.
  x: A large amount of bubbles and cracks are generated.

Experimental Example 4

Light Resistance Test

The light resistance was tested for 500 hours according to the ASTM G-154 standard, and the silicone-cured product formed on a film having a thickness of 5 mm was tested for light resistance using a transmission meter (ATLAS QUV) by measuring a final transmission ratio with respect to an initial transmission ratio measured before the light resistance test.

TABLE 1

|  | Example 1 | Example 2 | Example 3 | Comparative Example 1 |
|---|---|---|---|---|
| Surface resistivity (Ω/□) | $1.5 \times 10^{13}$ | $3.3 \times 10^{12}$ | $1.4 \times 10^{12}$ | $>10^{16}$ |
| Vibration damping | ○ | ○ | ○ | x |
| Heat/moisture resistance | ○ | ○ | ○ | ○ |
| Light resistance | 95% | 95% | 95% | 97% |

As can be seen from the results listed in Table 1, it was confirmed that the compositions according to the present invention as prepared in Examples 1 to 3 showed similar or more excellent properties such as durability and light resistance, compared to the composition prepared in Comparative Example 1 which did not include a conductivity-providing agent, and also had an excellent vibration damping characteristic.

According to the present invention, a silicone-cured product included as a main ingredient and a conductivity-providing agent having excellent compatibility and thus capable of providing superior conductivity without negatively affecting the excellent physical properties can be used to significantly reduce the surface resistivity of the silicone-cured product. Therefore, when the composition is, for example, used as a semiconductor encapsulation material for an LED according to the present invention, the encapsulating composition for a light emitting element, the LED and the LCD can be useful in solving the problems regarding attachment of a foreign substance such as dust due to static electricity, and degradation of transparency since the composition has low surface resistivity, and also in providing a cured product having excellent properties such as light resistance, heat resistance, durability and optical transparency.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An encapsulating composition for a light emitting element, comprising:
  a curable silicone compound which comprises (a) an alkoxy group-containing siloxane polymer, and (b) a hydroxyl group-containing siloxane polymer; and
  a conductivity-providing agent represented by the following Formula 1:

$$M^{a+}[X(YO_mR_f)_n]_a^- \qquad \text{[Formula 1]}$$

wherein $M^{a+}$ represents an inorganic or organic cation, X represents a nitrogen or carbon atom, Y represents a carbon or sulfur atom, $R_f$ represents a perfluoroalkyl group, a and m each independently represent an integer of 1 or 2, and n represents an integer of 2 or 3 (provided that m is the integer 1 when Y is a carbon atom, m is the integer 2 when Y is a sulfur atom, n is the integer 2 when X is a nitrogen atom, and n is the integer 3 when X is a carbon atom).

2. The composition of claim 1, wherein the inorganic cation is a lithium cation, a sodium cation, a potassium cation, a rubidium cation, a cesium cation, a calcium cation, a strontium cation, a barium cation or a radium cation.

3. The composition of claim 1, wherein the organic cation is a nitrogen-based cation.

4. The composition of claim 3, wherein the nitrogen-based cation is an ammonium cation, a pyrazolium cation, an imidazolium cation, a triazolium cation, a pyridinium cation, a pyridazinium cation, a pyrimidinium cation, a pyrazinium cation, a pyrrolidinium cation or a triazinium cation.

5. The composition of claim 4, wherein the ammonium cation is a cation represented by the following Formula 4:

[Formula 4]

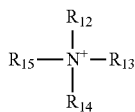

wherein $R_{12}$ to $R_{15}$ each independently represent hydrogen, a substituted or unsubstituted alkyl group, a substituted or unsubstituted alkoxy group, a substituted or unsubstituted alkenyl group or a substituted or unsubstituted alkynyl group.

6. The composition of claim 5, wherein the ammonium cation is at least one selected from the group consisting of N-ethyl-N,N-dimethyl-N-(2-methoxyethyl)ammonium, N,N-diethyl-N-methyl-N-(2-methoxyethyl)ammonium, N-ethyl-N,N-dimethyl-N-propylammonium, N-methyl-N,N,N-trioctylammonium, N,N,N-trimethyl-N-propylammonium, tetrabutylammonium, tetramethylammonium, tetrahexylammonium and N-methyl-N,N,N-tributylammonium.

7. The composition of claim 4, wherein the imidazolium cation is imidazolium, 1-allyl-3-alkyl imidazolium, 1-alkyl-3-allyl imidazolium, 1,3-bisallyl imidazolium, 1,3-dialkyl imidazolium, 1-arylalkyl-3-alkyl imidazolium, 1,3-bis(arylalkyl) imidazolium, 1-aryl-3-alkyl imidazolium, 1,3-bisaryl imidazolium, 1,3-bis(cyanoalkyl) imidazolium or 1-alkyl-2,3-bisalkyl imidazolium.

8. The composition of claim 1, wherein the conductivity-providing agent includes at least one selected from the group consisting of N-ethyl-N,N-dimethyl-N-(2-methoxyethyl) ammonium bistrifluoromethanesulfonimide, N,N-diethyl-N-methyl-N-(2-methoxyethyl)ammonium bistrifluoromethanesulfonimide, N-ethyl-N,N-dimethyl-N-propylammonium bistrifluoromethanesulfonimide, N-methyl-N,N,N-trioctylammonium bistrifluoromethanesulfonimide, N-methyl-N,N,N-trioctylammonium bispentafluoroethanesulfonimide, N-methyl-N,N,N-trioctylammonium tristrifluoromethanecarbonyl methide, N,N,N-trimethyl-N-propylammonium bistrifluoromethanesulfonimide, tetrabutylammonium bistrifluoromethanesulfonimide, tetramethylammonium bistrifluoromethanesulfonimide, tetrahexylammonium bistrifluoromethanesulfonimide, N-methyl-N,N,N-tributylammonium bistrifluoromethanesulfonimide, 1,3-dialkyl imidazolium bistrifluoromethanesulfonimide, 1,3-dialkyl imidazolium bisperfluorobutanesulfonimide, 1,3-dialkyl imidazolium bispentafluoroethanesulfonimide, 1,3-dialkyl imidazolium tristrifluoromethanecarbonyl methide, 1,3-dialkyl imidazolium bisperfluorobutanecarbonylimide and 1,3-dialkyl imidazolium bispentafluoroethanecarbonylimide.

9. The composition of claim 1, wherein the conductivity-providing agent is included at a content of 0.01 parts by weight to 20 parts by weight, based on 100 parts by weight of the curable silicone compound.

10. A light emitting diode (LED) comprising the light emitting element encapsulated by a cured product of the encapsulating composition for a light emitting element of claim 1.

11. The LED of claim 10, wherein the cured product has a surface resistivity of $5 \times 10^{14}$ Ω/square (□) or less.

12. A liquid crystal display device comprising the LED of claim 10 as a backlight.

* * * * *